United States Patent
Cho et al.

(10) Patent No.: US 11,211,504 B2
(45) Date of Patent: Dec. 28, 2021

(54) SOLAR CELL

(71) Applicant: LG ELECTRONICS INC., Seoul (KR)

(72) Inventors: Haejong Cho, Seoul (KR); Donghae Oh, Seoul (KR); Juhwa Cheong, Seoul (KR); Junyong Ahn, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 373 days.

(21) Appl. No.: 15/889,950

(22) Filed: Feb. 6, 2018

(65) Prior Publication Data

US 2018/0226520 A1    Aug. 9, 2018

(30) Foreign Application Priority Data

Feb. 7, 2017    (KR) .................. 10-2017-0016816
Apr. 5, 2017    (KR) .................. 10-2017-0044075
Nov. 28, 2017    (KR) .................. 10-2017-0160457

(51) Int. Cl.
*H01L 31/0224*    (2006.01)
*H01B 1/16*    (2006.01)
(Continued)

(52) U.S. Cl.
CPC ........ *H01L 31/022425* (2013.01); *C03C 4/14* (2013.01); *C03C 8/10* (2013.01); *C03C 8/18* (2013.01); *H01B 1/16* (2013.01); *H01L 31/02167* (2013.01); *H01L 31/02168* (2013.01); *H01L 31/02363* (2013.01);
(Continued)

(58) Field of Classification Search
CPC ........ H01L 31/02167; H01L 31/02168; H01L 31/022425; H01L 31/02363; H01L 31/03682; H01L 31/068; H01L 31/1864; H01L 31/1868
See application file for complete search history.

(56) References Cited

U.S. PATENT DOCUMENTS

2008/0290368 A1    11/2008    Rubin
2011/0126907 A1*    6/2011    Lee .................. H01L 31/02167
                                                                    136/261
(Continued)

FOREIGN PATENT DOCUMENTS

CN    104039728 A    9/2014
CN    104040733 A    9/2014
(Continued)

*Primary Examiner* — Mayla Gonzalez Ramos
(74) *Attorney, Agent, or Firm* — Birch, Stewart, Kolasch & Birch, LLP

(57) ABSTRACT

A solar cell is disclosed. The solar cell includes a first conductive region positioned at a front surface of a semiconductor substrate and containing impurities of a first conductivity type or a second conductivity type, a second conductive region positioned at a back surface of the semiconductor substrate and containing impurities of a conductivity type opposite a conductivity type of impurities of the first conductive region, a first electrode positioned on the front surface of the semiconductor substrate and connected to the first conductive region, and a second electrode positioned on the back surface of the semiconductor substrate and connected to the second conductive region. Each of the first and second electrodes includes metal particles and a glass frit.

16 Claims, 7 Drawing Sheets

(51) Int. Cl.
*C03C 8/18* (2006.01)
*C03C 4/14* (2006.01)
*C03C 8/10* (2006.01)
*H01L 31/0216* (2014.01)
*H01L 31/0368* (2006.01)
*H01L 31/068* (2012.01)
*H01L 31/0236* (2006.01)
*H01L 31/18* (2006.01)

(52) U.S. Cl.
CPC ...... *H01L 31/03682* (2013.01); *H01L 31/068* (2013.01); *C03C 2204/00* (2013.01); *C03C 2205/00* (2013.01); *H01L 31/1864* (2013.01); *Y02E 10/50* (2013.01)

(56) References Cited

U.S. PATENT DOCUMENTS

2013/0220411 A1* 8/2013 Lee .................. H01L 31/02168
136/256

2014/0021417 A1* 1/2014 Koike ...................... C03C 8/14
252/514
2014/0299187 A1* 10/2014 Chang ............... H01L 31/02167
136/258
2014/0318618 A1* 10/2014 Paik ......................... B22F 9/24
136/256

FOREIGN PATENT DOCUMENTS

| CN | 104838505 A | 8/2015 |
| CN | 105655427 A | 6/2016 |
| JP | 2008-543080 A | 11/2008 |
| JP | 2011-35035 A | 2/2011 |
| JP | 2014-209598 A | 11/2014 |
| JP | 2015-509899 A | 4/2015 |
| JP | 2016-103642 A | 6/2016 |
| KR | 10-2015-0045831 A | 4/2015 |
| KR | 10-2015-0136465 A | 12/2015 |
| KR | 10-2016-0029501 A | 3/2016 |
| KR | 10-2016-0064702 A | 6/2016 |
| WO | WO 2006/132766 A2 | 12/2006 |
| WO | WO 2014/016954 A1 | 1/2014 |

* cited by examiner

FIG. 3

| Content of glass frit [wt%] | Contact resistance [Ω] | Passivation function (Recombination level) | Open-circuit voltage (Voc) | |
|---|---|---|---|---|
| 0.5 wt% | × | ◎ | ◎ | |
| 1.0 wt% | × | ◎ | ◎ | |
| 1.5 wt% | × | ◎ | ◎ | |
| 2.0 wt% | × | ◎ | ◎ | |
| 2.5 wt% | △ | ◎ | ◎ | ⎫ |
| 3.0 wt% | ○ | ◎ | ◎ | ⎪ |
| 3.5 wt% | ◎ | ◎ | ◎ | ⎬ Appropriate level |
| 4.0 wt% | ◎ | ◎ | ◎ | ⎪ |
| 4.5 wt% | ◎ | ○ | ○ | ⎪ |
| 5.0 wt% | ◎ | △ | ○ | ⎭ |
| 5.5 wt% | ◎ | × | △ | |
| 6.0 wt% | ◎ | × | △ | |
| 6.5 wt% | ◎ | × | × | |
| 7.0 wt% | ◎ | × | × | |

◎ : Excellent    ○ : Good    △ : Moderate    × : Bad

SOLAR CELL

CROSS-REFERENCE TO RELATED APPLICATIONS

This application claims the priority benefit of the Korean Patent Application No. 10-2017-0016816 filed on Feb. 7, 2017, Korean Patent Application No. 10-2017-0044075 filed on Apr. 5, 2017, and Korean Patent Application No. 10-2017-0160457 filed Nov. 28, 2017, the contents of all of which are hereby incorporated by reference in their entirety.

BACKGROUND OF THE INVENTION

Field of the Invention

Embodiments of the invention relate to a solar cell.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy are attracting attention because they are rich in energy resources and have no problem of environmental pollution.

A solar cell generally includes a substrate and an emitter region formed of semiconductors which respectively have different conductivity types, for example, a p-type and an n-type, and electrodes respectively connected to the substrate and the emitter region of the different conductivity types. In this instance, the substrate and the emitter region form a p-n junction.

When light is incident on the solar cell, a plurality of electron-hole pairs are produced in the semiconductors and are separated into electrons and holes by the incident light. The electrons move to the n-type semiconductor, for example, the emitter region, and the holes move to the p-type semiconductor, for example, the substrate. Then, the electrons and the holes are collected by the electrodes electrically connected to the substrate and the emitter region. The electrodes are connected to each other using electric wires to thereby obtain electric power.

A solar cell including a conductive region formed by doping a back surface of a semiconductor substrate with impurities and a passivation layer between the conductive region and the semiconductor substrate is recently under development to improve an open-circuit voltage Voc.

However, because a thickness of the conductive region in the solar cell having the above-described structure is greatly less than a thickness according to a related art, a back electrode is short-circuited with the semiconductor substrate because metal particles included in the back electrode penetrate the passivation layer between the conductive region and the semiconductor substrate when the back electrode connected to the conductive region is formed. Hence, there is a problem that a defect of the solar cell is caused.

SUMMARY OF THE INVENTION

Embodiments of the invention provide a solar cell having a structure capable of reducing a defect of the solar cell while improving an open-circuit voltage.

In one aspect, there is provided a solar cell including a semiconductor substrate; a first conductive region positioned at a front surface of the semiconductor substrate, the first conductive region containing impurities of a first conductivity type or impurities of a second conductivity type; a second conductive region positioned at a back surface of the semiconductor substrate, the second conductive region containing impurities of a conductivity type opposite a conductivity type of impurities contained in the first conductive region, and the second conductive region including a silicon material; a first electrode positioned on the front surface of the semiconductor substrate and connected to the first conductive region; and a second electrode positioned on the back surface of the semiconductor substrate and connected to the second conductive region, wherein each of the first and second electrodes includes metal particles and a glass frit, and wherein a content of the glass frit per unit volume contained in the second electrode is less than a content of the glass frit per unit volume contained in the first electrode.

For example, the content of the glass frit per unit volume contained in the first electrode may be 6 wt % to 8 wt %, and the content of the glass frit per unit volume contained in the second electrode may be 2.5 wt % to 5.0 wt %.

A content of the metal particles per unit volume contained in the first electrode may be more than a content of the metal particles per unit volume contained in the second electrode. For example, the content of the metal particles per unit volume contained in the first electrode may be 82 wt % to 92 wt %, and the content of the metal particles per unit volume contained in the second electrode may be 68 wt % to 73 wt %.

The solar cell may further include an anti-reflection layer positioned on a front surface of the first conductive region, a control passivation layer positioned between the back surface of the semiconductor substrate and the second conductive region, the control passivation layer including a dielectric material, and a back passivation layer positioned on a back surface of the second conductive region. A thickness of the back passivation layer may be less than a thickness of the anti-reflection layer and may be greater than a thickness of the control passivation layer.

For example, the thickness of the anti-reflection layer is 100 nm to 140 nm, and the thickness of the back passivation layer may be 65 nm to 105 nm within a range that is less than the thickness of the anti-reflection layer.

The thickness of the control passivation layer may be less than the thickness of the back passivation layer and may be, for example, 0.5 nm to 10 nm.

Further, a thickness of the second conductive region may be less than a thickness of the first conductive region. For example, the thickness of the first conductive region may be 300 nm to 700 nm, and the thickness of the second conductive region may be 290 nm to 390 nm within a range that is less than the thickness of the first conductive region.

The glass frit of the second electrode may include at least one of a PbO-based material and a BiO-based material.

The glass frit of the second electrode may further include tellurium oxide (TeO).

A melting point of the glass frit including tellurium oxide (TeO) may be 200° C. to 500° C.

The second electrode may include a first layer where the glass frit including tellurium oxide (TeO) is positioned at an interface between the second electrode and the second conductive region, and a second layer where the metal particles and the glass frit not including tellurium oxide (TeO) is positioned on the first layer.

Further, crystallites formed by combining the metal particles of the second electrode and silicon of the second conductive region may be distributed at an interface between the first layer and the second conductive region.

The glass frit of the first electrode may include at least one of a PbO-based material and a BiO-based material. The glass frit of the first electrode may further include tellurium oxide (TeO).

The metal particles of the first electrode may include first metal particles having a circular shape or an oval shape and second metal particles which have a long axis and have a plate shape having an uneven surface. The metal particles of the second electrode may include the first metal particles and may not include the second metal particles.

A length of the long axis of the second metal particle included in the first electrode may be greater than a size of the first metal particle included in each of the first and second electrodes.

In another aspect, there is provided a solar cell including a semiconductor substrate; a first conductive region positioned at a front surface of the semiconductor substrate, the first conductive region containing impurities of a first conductivity type or impurities of a second conductivity type; a control passivation layer positioned on a back surface of the semiconductor substrate, the control passivation layer including a dielectric material; a second conductive region positioned at the back surface of the semiconductor substrate, the second conductive region containing impurities of a conductivity type opposite a conductivity type of impurities contained in the first conductive region, and the second conductive region including a polycrystalline silicon material; a first electrode positioned on the front surface of the semiconductor substrate and connected to the first conductive region; and a second electrode positioned on the back surface of the semiconductor substrate and connected to the second conductive region, wherein each of the first and second electrodes includes metal particles and a glass frit, and wherein the glass frit of the first electrode includes tellurium oxide (TeO).

The glass frit of the second electrode may include tellurium oxide (TeO).

Embodiments of the invention allow a content of the glass frit contained in the second electrode positioned on the back surface of the semiconductor substrate to be less than a content of the glass frit contained in the first electrode positioned on the front surface of the semiconductor substrate and thus can control a depth to which the second electrode is fired through when the second electrode is connected to the second conductive region through a thermal process.

Accordingly, embodiments of the invention can prevent the metal particles of the second electrode penetrating the second conductive region and the control passivation layer from being short-circuited with the semiconductor substrate and prevent a defect that may occur in a manufacturing process while increasing an open-circuit voltage Voc of the solar cell.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 3 is a table indicating an experimental result of a contact resistance, a passivation function (or a recombination level), and an open-circuit voltage depending on a content of a glass frit included in a second electrode.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the following description, a content of metal particles and a content of a glass frit indicate a content per unit volume unless otherwise specified.

Embodiments of the invention will be described with reference to FIGS. 1 to 7.

Figure 1:
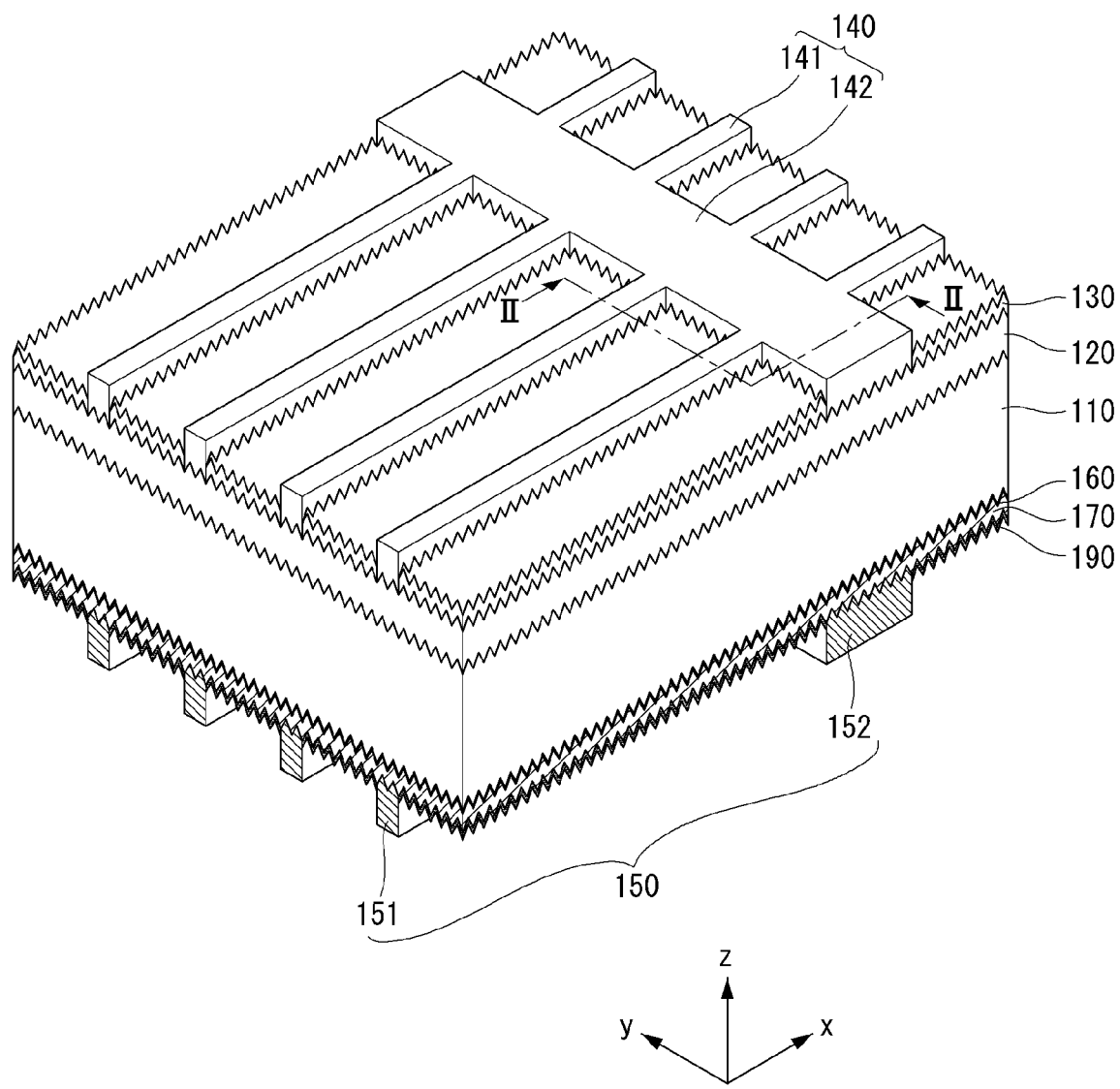
FIG. 1 is a partial perspective view of a solar cell according to an embodiment of the invention.
Figure 2:
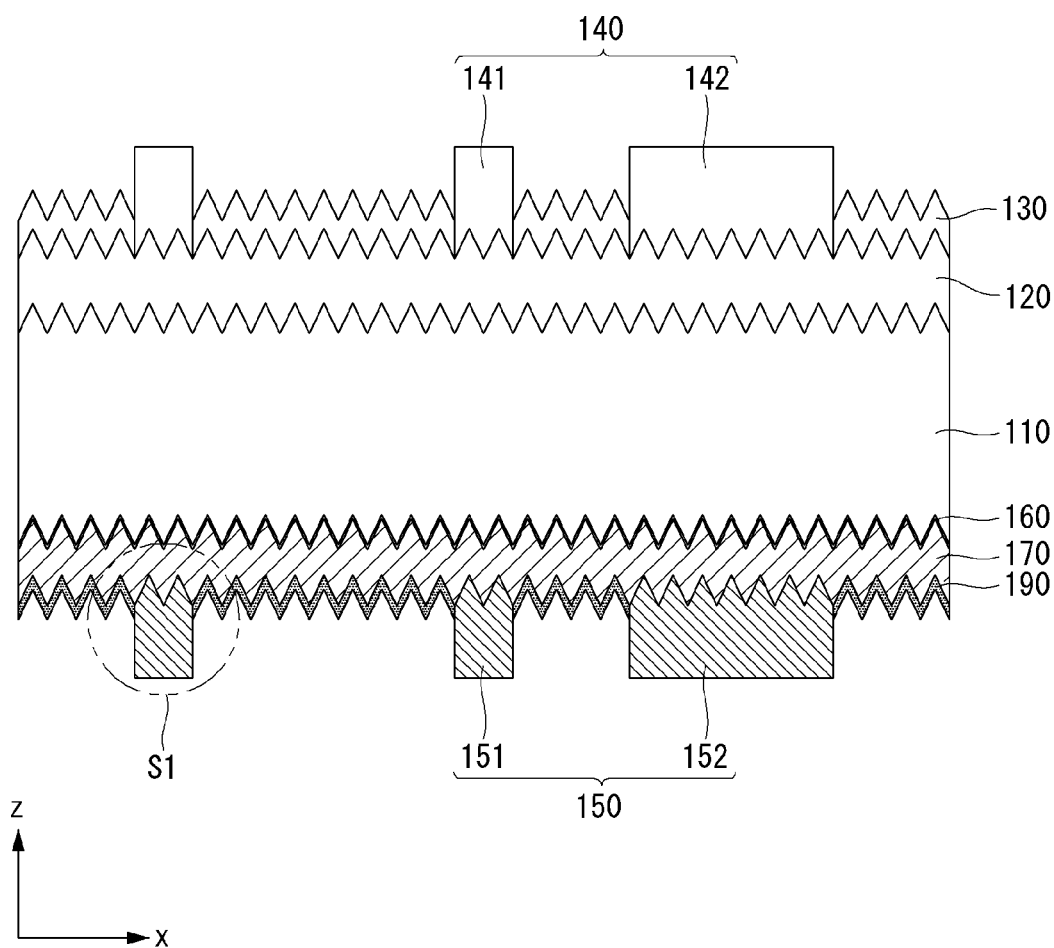
FIG. 2 is a cross-sectional view of a solar cell shown in FIG. 1.

FIG. 1 is a partial perspective view of a solar cell according to an embodiment of the invention. FIG. 2 is a cross-sectional view of a solar cell shown in FIG. 1.

As shown in FIG. 1, an example of a solar cell according to an embodiment of the invention may include a semiconductor substrate 110, a first conductive region 120, an anti-reflection layer 130, a control passivation layer 160, a second conductive region 170, a back passivation layer 190, a first electrode 140, and a second electrode 150.

FIG. 1 illustrates that the solar cell according to the embodiment of the invention includes the anti-reflection layer 130, by way of example. However, embodiments are not limited thereto. For example, the anti-reflection layer 130 may be omitted, if desired or necessary. However, when the solar cell includes the anti-reflection layer 130, efficiency of the solar cell can be further improved. Thus, the embodiment of the invention is described using the solar cell including the anti-reflection layer 130 as an example.

The semiconductor substrate 110 may be formed of at least one of single crystal silicon and polycrystalline silicon each containing impurities of a first conductivity type or a second conductivity type. For example, the semiconductor substrate 110 may be formed of a single crystal silicon wafer.

The semiconductor substrate 110 may include impurities of the first conductivity type or impurities of the second conductivity type. In embodiments disclosed herein, impurities of the first conductivity type may be impurities of an n-type or a p-type, and impurities of the second conductivity type may be impurities of a conductivity type opposite the first conductivity type.

For example, when the first conductivity type is the p-type, the second conductivity type may be the n-type. On the contrary, when the first conductivity type is the n-type, the second conductivity type may be the p-type.

In the following description, an embodiment in which the first conductivity type is the p-type, the second conductivity type is the n-type, and the semiconductor substrate 110 contains impurities of the second conductivity type, i.e., n-type impurities will be described as an example.

When the semiconductor substrate 110 is of the p-type, the semiconductor substrate 110 may be doped with impurities of a group III element such as boron (B), gallium (Ga), and indium (In). Alternatively, when the semiconductor substrate 110 is of the n-type, the semiconductor substrate 110 may be doped with impurities of a group V element such as phosphorus (P), arsenic (As), and antimony (Sb).

In the following description, embodiments of the invention are described using an example where impurities contained in the semiconductor substrate 110 are impurities of the second conductivity type and are n-type impurities. However, embodiments of the invention are not limited thereto.

A front surface and a back surface of the semiconductor substrate 110 may be an uneven surface having a plurality of texturing uneven portions or having uneven characteristics. Thus, the first conductive region 120 positioned at the front surface of the semiconductor substrate 110 may have an uneven surface, and the second conductive region 170 positioned at the back surface of the semiconductor substrate 110 may have an uneven surface.

In embodiments disclosed herein, "texturing uneven portion" indicates an uneven portion formed on the surface of the solar cell in order to reduce an amount of reflected light and may have, for example, a pyramid shape.

Hence, an amount of light reflected from the front surface of the semiconductor substrate 110 can decrease, and an amount of light incident on the inside of the semiconductor substrate 110 can increase.

The first conductive region 120 is positioned at the front surface of the semiconductor substrate 110 on which light is incident, and may contain impurities of the first conductivity type or the second conductivity type.

Thus, the first conductive region 120 may contain n-type impurities or p-type impurities.

For example, when the semiconductor substrate 110 contains n-type impurities, the first conductive region 120 may contain p-type impurities and form a p-n junction together with the semiconductor substrate 110. In this instance, the first conductive region 120 may serve as an emitter region.

On the contrary, when the semiconductor substrate 110 contains p-type impurities, the first conductive region 120 may contain n-type impurities at a higher concentration than the semiconductor substrate 110 and may serve as a front surface field region.

Alternatively, when the semiconductor substrate 110 contains p-type impurities, the first conductive region 120 may contain n-type or p-type impurities. When the first conductive region 120 is of an n-type, impurities of a group V element such as phosphorus (P), arsenic (As), and antimony (Sb) may be distributed into the front surface of the semiconductor substrate 110 through a thermal process to form the first conductive region 120.

On the contrary, when the first conductive region 120 is of a p-type, impurities of a group III element such as boron (B), gallium (Ga), and indium (In) may be distributed into the front surface of the semiconductor substrate 110 through the thermal process to form the first conductive region 120.

In the following description, embodiments of the invention are described using an example where the first conductive region 120 contains impurities of a conductivity type opposite a conductivity type of impurities contained in the semiconductor substrate 110 to serve as an emitter region.

Because the first conductive region 120 is formed by distributing n-type or p-type impurities into the front surface of the semiconductor substrate 110 as described above, the first conductive region 120 may be formed of single crystal silicon material or polycrystalline silicon material that is the same as the semiconductor substrate 110.

Thus, when the semiconductor substrate 110 is formed of a single crystal silicon wafer, the first conductive region 120 may be formed of a single crystal silicon wafer. When the semiconductor substrate 110 is formed of a polycrystalline silicon wafer, the first conductive region 120 may be formed of a polycrystalline silicon wafer.

A thickness of the first conductive region 120 may be 300 nm to 700 nm.

The anti-reflection layer 130 is positioned on the first conductive region 120. The anti-reflection layer 130 may be formed of at least one of aluminum oxide (AlOx), silicon nitride (SiNx), silicon oxide (SiOx), and silicon oxynitride (SiOxNy) and may be formed as a single layer or a plurality of layers.

The anti-reflection layer 130 can reduce a reflectance of light incident on the solar cell and increase selectivity of a predetermined wavelength band, thereby increasing the efficiency of the solar cell.

A thickness of the anti-reflection layer 130 may be 100 nm to 140 nm.

The first electrode 140 is disposed on the first conductive region 120 and directly contacts the first conductive region 120. The first electrode 140 may be electrically connected to the first conductive region 120.

As shown in FIGS. 1 and 2, the first electrode 140 may include a plurality of first finger electrodes 141 extended in a first direction x (for example, x-axis direction) and a plurality of first bus bar electrodes 142 that is extended in a second direction y (for example, y-axis direction) intersecting the plurality of first finger electrodes 141 and connects the plurality of first finger electrodes 141.

As shown in FIGS. 1 and 2, when the semiconductor substrate 110 is of the n-type, the first electrode 140 may collect carriers (e.g., holes) moving to the p-type first conductive region 120.

The first electrode 140 is connected to an interconnector (not shown) connecting solar cells to each other and outputs collected carriers to an external device.

The first electrode 140 may include metal particles and a glass frit. More specifically, the metal particle may include at least one of nickel (Ni), copper (Cu), silver (Ag), aluminum (Al), tin (Sn), zinc (Zn), indium (In), titanium (Ti), gold (Au), and a combination thereof.

A melting point of the metal particle may be higher than a melting point of the glass frit. Thus, after the first electrode 140 is completed, the metal particles may maintain an original shape that they had in a paste state, and the glass frit may be fired after it is completely melted. Therefore, the glass frit may have a different shape from a shape that it had in a paste state.

The first electrode 140 may be formed by patterning a first electrode paste on the anti-reflection layer 130 in a state where the anti-reflection layer 130 is formed on a front surface of the first conductive region 120, causing the first electrode paste to penetrate the anti-reflection layer 130 while the first electrode paste is fired through the anti-reflection layer 130 through a thermal process, and firing the first electrode paste in a state where the first electrode paste is electrically connected to the first conductive region 120.

The control passivation layer 160 is entirely positioned on the back surface of the semiconductor substrate 110 and may include a dielectric material.

For example, as shown in FIGS. 1 and 2, the control passivation layer 160 on the back surface of the semiconductor substrate 110 may directly contact the back surface of the semiconductor substrate 110.

Further, the control passivation layer 160 may be formed on the entire back surface except an edge of the back surface of the semiconductor substrate 110.

The control passivation layer 160 can perform a dopant control function or a diffusion barrier that prevents a dopant of the second conductive region 170 from being excessively diffused into the semiconductor substrate 110. In addition, the control passivation layer 160 can perform a passivation function of the back surface of the semiconductor substrate 110.

The control passivation layer 160 may include various materials that can control the diffusion of the dopant and transfer multiple carriers. For example, the control passivation layer 160 may include oxide, nitride, semiconductor, conducting polymer, or the like.

For example, the control passivation layer 160 may be a silicon oxide layer including silicon oxide. This is because the silicon oxide layer has good passivation characteristics and smoothly transfers carriers.

Further, the silicon oxide layer may be easily formed on the surface of the semiconductor substrate 110 by various processes.

The control passivation layer 160 may be formed by various methods such as vapor deposition, thermal oxidation, and chemical oxidation. However, the control passivation layer 160 may be omitted, if necessary or desired.

A thickness of the control passivation layer 160 may be less than a thickness of the back passivation layer 190 and may be, for example, 0.5 nm to 10 nm. The control passivation layer 160 may be formed by an oxidation process, a low pressure chemical vapor deposition (LPCVD) process, or a plasma-enhanced chemical vapor deposition (PECVD) process.

A reason why the thickness of the control passivation layer 160 is limited to 0.5 nm to 10 nm is to implement a tunneling effect. The control passivation layer 160 can perform a portion of a passivation function on the back surface of the semiconductor substrate 110.

The second conductive region 170 is positioned at the back surface of the semiconductor substrate 110. The second conductive region 170 may contain impurities of a conductivity type opposite a conductivity type of impurities contained in the first conductive region 120 and may be formed of a polycrystalline silicon material.

Thus, when the first conductive region 120 serves as the emitter region, the second conductive region 170 may serve as a back surface field region.

As shown in FIGS. 1 and 2, the second conductive region 170 may be positioned at a back surface of the control passivation layer 160 and spaced apart from the semiconductor substrate 110.

The second conductive region 170 may be formed on the control passivation layer 160 using a chemical vapor deposition (CVD) method. For example, the second conductive region 170 may be formed by depositing a polycrystalline silicon material containing impurities of the first conductivity type on the control passivation layer 160. Alternatively, the second conductive region 170 may be formed by depositing an amorphous silicon material containing impurities of the first conductivity type on the control passivation layer 160 and then crystallizing the amorphous silicon material into a polycrystalline silicon material through a thermal process.

Hence, as shown in FIGS. 1 and 2, the second conductive region 170 is not formed inside the semiconductor substrate 110 and is formed on the back surface of the semiconductor substrate 110 so that it does not directly contact the semiconductor substrate 110 and is spaced apart from the semiconductor substrate 110. As described above, when the second conductive region 170 is formed on the back surface of the control passivation layer 160, an open-circuit voltage Voc of the solar cell can be further improved.

Because the second conductive region 170 is not formed inside the semiconductor substrate 110 and is formed outside the semiconductor substrate 110, the thermal processing of the semiconductor substrate 110 can be minimized in a process for forming the second conductive region 170. Hence, a reduction in characteristics of the semiconductor substrate 110 can be prevented, and the efficiency of the solar cell according to the embodiment of the invention can be further improved.

A thickness of the second conductive region 170 may be determined in consideration of a deposition time of the second conductive region 170 and also selected as an appropriate thickness capable of sufficiently performing a function of the second conductive region 170. For example, the thickness of the second conductive region 170 may be 290 nm to 390 nm within a range that is less than the thickness of the first conductive region 120.

The second electrode 150 is disposed on the second conductive region 170 and directly contacts the second conductive region 170. The second electrode 150 may be electrically connected to the second conductive region 170.

As shown in FIGS. 1 and 2, the second electrode 150 may include a plurality of second finger electrodes 151 extended in the first direction x and a plurality of second bus bar electrodes 152 that is extended in the second direction y intersecting the plurality of second finger electrodes 151 and connects the plurality of second finger electrodes 151.

The second electrode 150 is connected to an interconnector connecting solar cells to each other and outputs collected carriers to the external device.

The second electrode 150 may include metal particles and a glass frit. More specifically, the metal particle having a melting point higher than a melting point of the glass frit may include at least one of nickel (Ni), copper (Cu), silver (Ag), aluminum (Al), tin (Sn), zinc (Zn), indium (In), titanium (Ti), gold (Au), and a combination thereof.

The second electrode 150 may be formed by patterning a second electrode paste on a back surface of the back passivation layer 190 in a state where the back passivation layer 190 is formed on a back surface of the second conductive region 170, causing the second electrode paste to penetrate the back passivation layer 190 while the second electrode paste is fired through the back passivation layer 190 through a thermal process, and firing the second electrode paste in a state where the second electrode paste is electrically connected to the second conductive region 170.

As shown in FIGS. 1 and 2, the back passivation layer 190 may be positioned on a remaining portion excluding a formation portion of the second electrode 150 from the back surface of the second conductive region 170.

The back passivation layer 190 may include a dielectric material and may be formed as a single layer or a plurality of layers. The back passivation layer 190 may have specific fixed carriers in consideration of a conductivity type of the second conductive region 170.

The back passivation layer 190 may be formed of at least one of silicon carbide (SiC), silicon oxide (SiOx), silicon nitride (SiNx), hydrogenerated SiNx, aluminum oxide (AlOx), silicon oxynitride (SiON), or hydrogenerated SiON.

The back passivation layer 190 may perform a passivation function of the back surface of the second conductive region 170.

The thickness of the back passivation layer 190 may be greater than the thickness of the control passivation layer 160 and may be less than the thickness of the anti-reflection layer 130, in order to sufficiently perform the passivation function of the back surface of the second conductive region 170.

Thus, the thickness of the back passivation layer 190 may be, for example, 65 nm to 105 nm within a range that is greater than the thickness of the control passivation layer 160 and is less than the thickness of the anti-reflection layer 130.

So far, the embodiment of the invention described that the first conductive region 120 serves as the emitter region and the second conductive region 170 serves as the back surface field region, by way of example.

However, embodiments are not limited thereto. For example, the semiconductor substrate 110 may contain p-type impurities, the first conductive region 120 may contain p-type impurities and serve as a front surface field region, and the second conductive region 170 may contain n-type impurities and serve as a back surface field region In the above-described solar cell, each of the first and second electrodes 140 and 150 may include the metal particles and the glass frit.

In embodiments disclosed herein, the metal particles may be, for example, Ag particles and may be related to the conductivity of each of the first and second electrodes 140 and 150. The glass frit may be related to a depth to which each of the first and second electrodes 140 and 150 is fired through.

The glass frit used in the first and second electrodes 140 and 150 according to the embodiment of the invention may include at least one of PbO-based material or BiO-based material.

A content of the metal particles and a content of the glass frit included in each of the first and second electrodes 140 and 150 may be differently determined in consideration of the materials and the thicknesses of the first conductive region 120 and the second conductive region 170.

For example, a content of the metal particles per unit volume contained in the first electrode 140 may be larger than a content of the metal particles per unit volume contained in the second electrode 150.

The first electrode 140 collects holes having a relatively slow moving speed, and a linewidth of the first electrode 140 has to be smaller than a linewidth of the second electrode 150 so that a larger amount of light is received. Therefore, the first electrode 140 may be necessary to have the conductivity relatively greater than the conductivity of the second electrode 150.

To this end, the content of the metal particles per unit volume contained in the first electrode 140 may be larger than the content of the metal particles per unit volume contained in the second electrode 150.

For example, the content of the metal particles per unit volume contained in the first electrode 140 may be 82 wt % to 92 wt %, and the content of the metal particles per unit volume contained in the second electrode 150 may be 68 wt % 73 wt %.

As described above with reference to FIGS. 1 and 2, in the structure of the solar cell according to the embodiment of the invention, the first conductive region 120 may be formed of, for example, a single crystal silicon substrate that is the same as the semiconductor substrate 110; the second conductive region 170 may be formed of a polycrystalline silicon material; the thickness of the second conductive region 170 may be relatively less than the thickness of the first conductive region 120; and the thickness of the back passivation layer 190 may be less than the thickness of the anti-reflection layer 130.

When the second electrode paste containing a glass frit having the same content as a content of a glass frit contained in the first electrode paste is patterned on the control passivation layer 160 that is very thin or relatively thin, the second conductive region 170, and the back passivation layer 190 and is thermally processed, the second electrode paste may penetrate the control passivation layer 160 as well as the back passivation layer 190 and the second conductive region 170 during the thermal process, may be directly electrically connected to the semiconductor substrate 110, and may be short-circuited with the semiconductor substrate 110.

Thus, the embodiment of the invention can allow a content of a glass frit contained in the second electrode 150 to be different from a content of a glass frit contained in the first electrode 140.

More specifically, the embodiment of the invention can allow a content of a glass frit per unit volume contained in the second electrode 150 to be less than a content of a glass frit per unit volume contained in the first electrode 140, in order to control a depth to which the second electrode paste penetrating the back passivation layer 190 is fired through toward the second conductive region 170.

Thus, the depth to which the second electrode paste is fired through can be controlled by adjusting the content of the glass frit per unit volume.

More specifically, for example, when a content of a glass frit per unit volume in the first electrode 140 is 6 wt % to 8 wt %, a content of a glass frit per unit volume in the second electrode 150 may be 2.5 wt % to 5.0 wt %.

When the content of the glass frit per unit volume in the second electrode 150 is 2.5 wt % to 5.0 wt % as described above, the embodiment of the invention can maintain a contact resistance between the second electrode 150 and the second conductive region 170 at a sufficiently low level and prevent the second electrode 150, that penetrates the control passivation layer 160 as well as the back passivation layer 190 and the second conductive region 170, from being short-circuited with the semiconductor substrate 110. Further, the embodiment of the invention can prevent a recombination, which may occur in the back surface of the semiconductor substrate 110, due to the metal particles contained in the second electrode 150 and can allow the control passivation layer 160 to sufficiently perform the passivation function. In addition, the embodiment of the invention can prevent a damage of the control passivation layer 160 and improve the open-circuit voltage Voc of the solar cell at a good level.

An effect depending on a content of a glass frit of the second electrode 150 will be described in detail below with reference to FIGS. 3, 4, and 5.

FIG. 3 is a table indicating an experimental result of a contact resistance, a passivation function (or a recombination level), and an open-circuit voltage depending on a content of a glass frit included in the second electrode 150.

Figure 4:
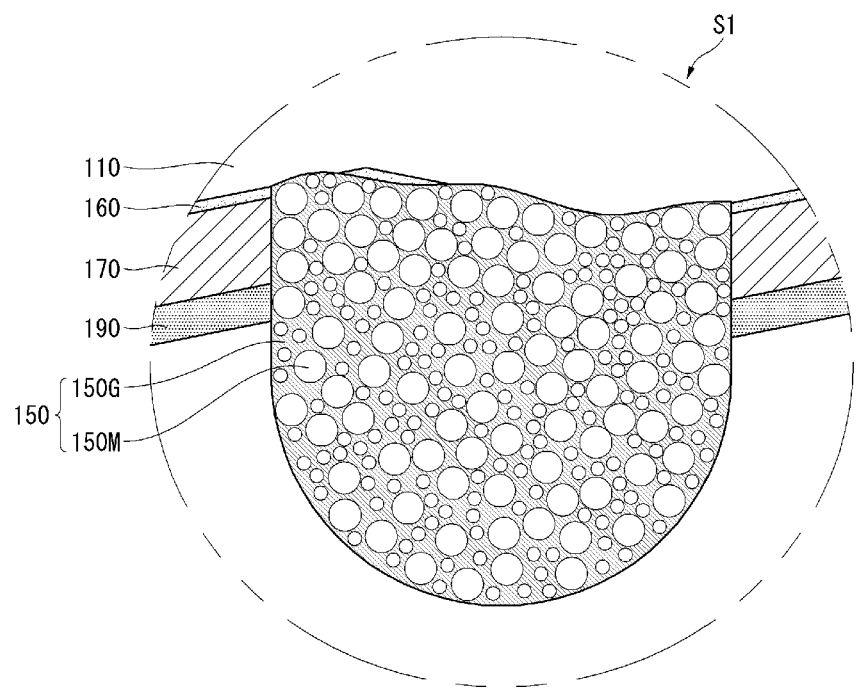
FIG. 4 is an enlarged cross-sectional view of a portion of a solar cell including a semiconductor substrate, a control passivation layer, a second conductive region, and a second electrode when a content of a glass frit of FIG. 3 exceeds an appropriate level.

FIG. 4 is an enlarged cross-sectional view Si of FIG. 2 of a portion of the solar cell including the semiconductor substrate 110, the control passivation layer 160, the second conductive region 170, and the second electrode 150 when a content of the glass frit of FIG. 3 exceeds an appropriate level.

Figure 5:
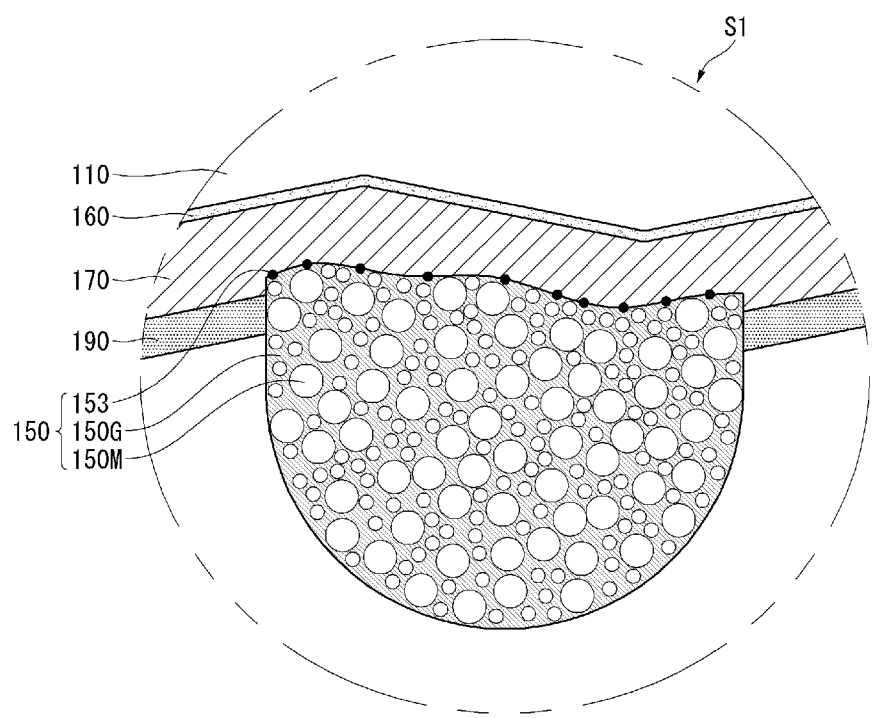
FIG. 5 is an enlarged cross-sectional view of a portion of a solar cell including a semiconductor substrate, a control passivation layer, a second conductive region, and a second electrode when a content of a glass frit of FIG. 3 is at an appropriate level.

FIG. 5 is an enlarged cross-sectional view Si of FIG. 2 of a portion of the solar cell including the semiconductor substrate 110, the control passivation layer 160, the second conductive region 170, and the second electrode 150 when a content of the glass frit of FIG. 3 is at the appropriate level.

In the table illustrated in FIG. 3, a content of a glass frit of the second electrode 150 indicates a content of a glass frit per unit volume and may be different from a content of a glass frit 150G per unit volume included in the second electrode paste.

This is because the second electrode paste before a thermal process may further include a binder of a resin material and a solvent in addition to metal particles 150M and the glass frit 150G, and the binder and the solvent may be mostly oxidized or evaporated during the thermal process.

Hence, as shown in FIGS. 4 and 5, after the thermal process, the metal particles 150M and the glass frit 150G may be present in the second electrode 150.

Thus, a content of the glass frit 150G of the second electrode paste may be different from a content of the glass frit 150G of the second electrode 150 that is fired after the thermal process. For example, the content of the glass frit 150G may increase by about 0.5 wt % to 1.0 wt %, as compared to before the second electrode 150 is fired.

In the table illustrated in FIG. 3, a content of the glass frit 150G of the second electrode 150 is a content in a state where the second electrode 150 is fired after the thermal process. An appropriate content of the glass frit 150G included in the second electrode paste before the thermal process may be 2.0 wt % to 4.0 wt % and may correspond to a range (i.e., 2.5 wt % to 5.0 wt %) of an appropriate content in the table illustrated in FIG. 3.

Embodiments of the invention relate to the structure of the solar cell, and thus describes below the structure of the solar cell based on the content of the glass frit 150G of the second electrode 150 that is fired after the thermal process.

In the table illustrated in FIG. 3, the contact resistance indicates a resistance between the second electrode 150 and the second conductive region 170. Thus, the bad contact resistance means that the electrical connection between the second electrode 150 and the second conductive region 170 is not properly performed because the second electrode 150 cannot penetrate the back passivation layer 190 as the depth to which the second electrode paste is fired through is very thin. Further, the good contact resistance means that the electrical connection between the second electrode 150 and the second conductive region 170 is properly performed.

The passivation function (or a recombination level) indicates a passivation function of the control passivation layer 160. Thus, the good passivation function means that the control passivation layer 160 is not damaged. Further, the bad passivation function means that the control passivation layer 160 is damaged by the second electrode 150, and a recombination occurs in the back surface of the semiconductor substrate 110 due to the metal particles 150M of the second electrode 150.

The good open-circuit voltage Voc means that the second conductive region 170 is spaced apart from the semiconductor substrate 110 by the control passivation layer 160, and the solar cell generates the open-circuit voltage Voc of an appropriate level. The bad open-circuit voltage Voc means that the control passivation layer 160 is damaged as the second electrode 150 deeply penetrates into the second conductive region 170, and the second electrode 150 and the semiconductor substrate 110 are short-circuited.

As indicated by the table of FIG. 3, when the content of the glass frit per unit volume contained in the second electrode 150 is less than 2.5 wt %, the depth to which the second electrode paste is fired through is very thin. Hence, the second electrode 150 is not properly connected to the second conductive region 170.

Further, as shown in FIG. 4, when the content of the glass frit per unit volume contained in the second electrode 150 exceeds 5.0 wt %, the second electrode 150 penetrates the control passivation layer 160 as well as the second conductive region 170 and is short-circuited with the semiconductor substrate 110. Hence, a function of the control passivation layer 160 is damaged, and the open-circuit voltage Voc is deteriorated.

In FIG. 4, "150M" denotes the metal particles contained in the second electrode 150, and "150G" denotes the glass frit contained in the second electrode 150.

When the content of the glass frit per unit volume contained in the second electrode 150 maintains an appropriate level of 2.5 wt % to 5.0 wt %, the depth to which the second electrode paste is fired through is appropriate. Hence, all of the contact resistance, the passivation function, and the open-circuit voltage are maintained at the excellent level.

Further, as shown in FIG. 5, when the content of the glass frit per unit volume contained in the second electrode 150 maintains the appropriate level of 2.5 wt % to 5.0 wt %, the second electrode 150 penetrates the back passivation layer 190 and penetrates into the second conductive region 170 at an appropriate depth. In this instance, alloy-crystallite (hereinafter referred to as "crystallite") obtained by combining the metal particles 150M of the second electrode 150 and silicon of the second conductive region 170 may be formed at an interface between the second electrode 150 and the second conductive region 170.

The metal particles 150M-silicon crystallite ("crystallite") 153 can further reduce the contact resistance between the second electrode 150 and the second conductive region 170.

So far, the embodiment of the invention described the content of the glass frit 150G per unit volume included in the second electrode 150, in order to control the depth to which the second electrode 150 penetrating the back passivation layer 190 is fired through inside the second conductive region 170.

The embodiment of the invention describes below an example where the glass frit 150G further includes tellurium oxide (TeO) so that the second electrode 150 penetrating the back passivation layer 190 is properly fired through toward the second conductive region 170 and is connected to the surface of the second conductive region 170 at an optimum level.

Figure 6:
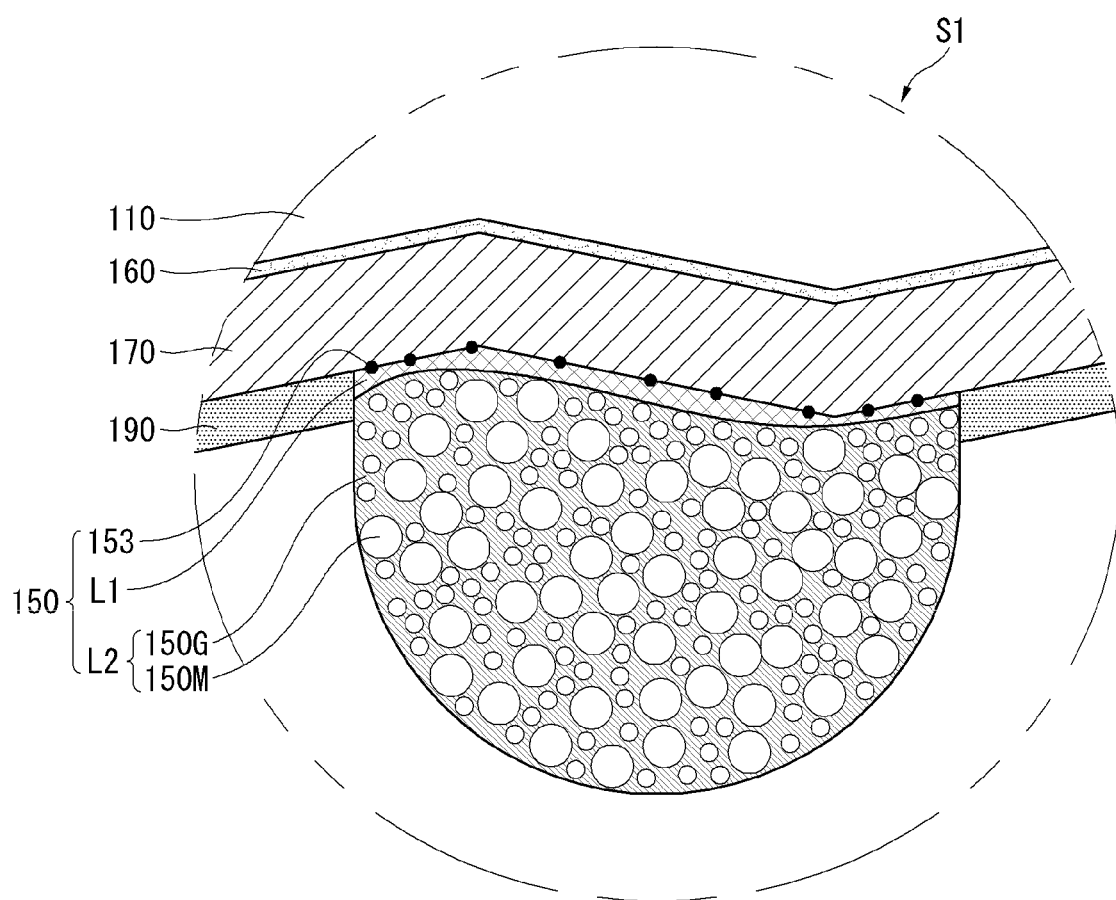
FIG. 6 is an enlarged cross-sectional view of a portion of a solar cell including a semiconductor substrate, a control passivation layer, a second conductive region, and a second electrode when a glass frit further includes tellurium oxide (TeO) in a state where a content of the glass frit of FIGS. 3 and 4 maintains an appropriate level.

FIG. 6 is an enlarged cross-sectional view 51 of FIG. 2 of a portion of the solar cell including the semiconductor substrate 110, the control passivation layer 160, the second conductive region 170, and the second electrode 150 when a glass frit further includes tellurium oxide (TeO) in a state where a content of the glass frit of FIGS. 3 and 4 maintains the appropriate level.

As described above, the second electrode 150 according to the embodiment of the invention may include the glass frit 150G of 2.5 wt % to 5.0 wt % per unit volume, and the glass frit 150G may include at least one of PbO-based material or BiO-based material and tellurium oxide (TeO).

A melting point of the glass frit 150G containing tellurium oxide (TeO) may be relatively lower. For example, the melting point of the glass frit 150G containing tellurium oxide (TeO) may be 200° C. to 500° C.

Thus, the glass frit 150G containing tellurium oxide (TeO) may be first melted when the second electrode paste is fired through in the thermal process and etches the back passivation layer 190.

In this instance, the glass frit 150G containing tellurium oxide (TeO) may be first widely positioned on the surface of the second conductive region 170 to form a layer. Afterwards, the metal particles 150M and the glass frit 150G not containing tellurium oxide (TeO) may be positioned on the layer on which the glass frit 150G containing tellurium oxide (TeO) is positioned.

Hence, as shown in FIG. 6, the second electrode 150 may include a first layer L1 where the glass frit 150G containing tellurium oxide (TeO) is positioned at an interface between the second electrode 150 and the second conductive region 170 and a second layer L2 where the metal particles 150M and the glass frit 150G not containing tellurium oxide (TeO) is positioned on the first layer L1.

The crystallites 153 formed by combining or a combination of the metal particles 150M and silicon of the second conductive region 170 may be distributed at an interface between the first layer L1 and the second conductive region 170.

Hence, the contact resistance between the second electrode 150 and the second conductive region 170 and the open-circuit voltage Voc can be further improved, and the depth to which the second electrode paste is fired through can be controlled more easily. As a result, a process margin of the solar cell can be further improved.

So far, the embodiment of the invention described the material and the material content of the second electrode 150 capable of controlling the depth, to which the second electrode paste is fired through, at the appropriate level.

However, the glass frit 150G containing tellurium oxide (TeO) may be applied to the first electrode 140 as well as the second electrode 150.

For example, a glass frit 150G included in the first electrode 140 may include at least one of PbO-based material or BiO-based material, and the glass frit 150G may further include tellurium oxide (TeO).

So far, the embodiment of the invention mainly described the glass frit included in each of the first and second electrodes 140 and 150. Hereinafter, metal particles included in the first and second electrodes 140 and 150 are described in detail.

Figure 7:
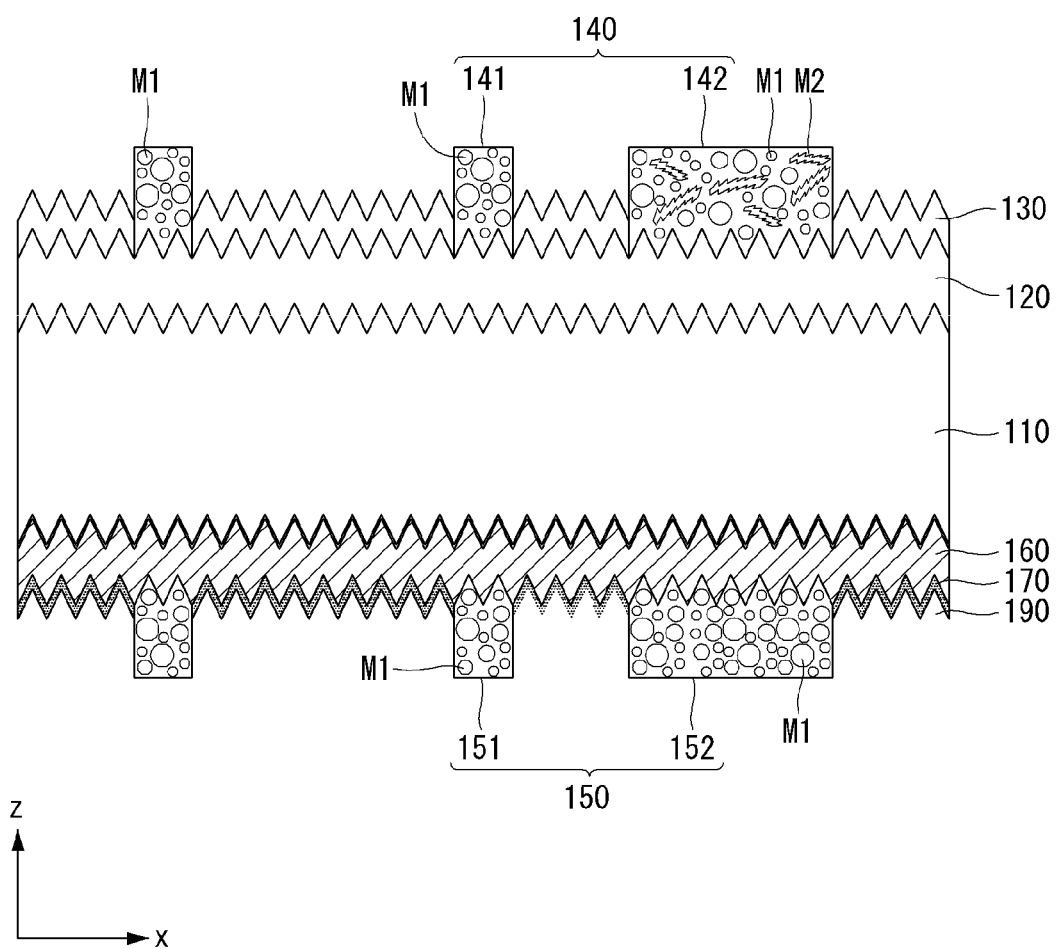
FIG. 7 illustrates metal particles included in first and second electrodes according to an embodiment of the invention.

FIG. 7 illustrates metal particles included in the first and second electrodes 140 and 150 according to the embodiment of the invention.

More specifically, FIG. 7 illustrates only metal particles M1 and M2 included in the first and second electrodes 140 and 150 and omits the illustration of the glass frit illustrated in FIGS. 5 and 6 for convenience of explanation.

As shown in FIG. 7, metal particles M1 and M2 may be included in the first and second electrodes 140 and 150.

More specifically, metal particles included in the first electrode 140 may include first metal particles M1 each having a sphere shape of a circle or an oval and second metal particles M2, each of which has a long axis and has a flake shape of a plate shape having an uneven surface. Further, metal particles included in the second electrode 150 may include the first metal particles M1 and may not include the second metal particles M2.

For example, as shown in FIG. 7, the first finger electrode 141 of the first electrode 140 may include the first metal particles M1, and the first bus bar electrode 142 of the first electrode 140 may include the first metal particles M1 and the second metal particles M2.

Further, the second finger electrode 151 and the second bus bar electrode 152 of the second electrode 150 may include the first metal particles M1 and may not include the second metal particles M2.

A length of the long axis of the second metal particle M2 included in the first electrode 140 may be greater than a size of the first metal particle M1 included in each of the first and second electrodes 140 and 150.

For example, a diameter of the first metal particle M1 may be 200 nm to 2.5 μm, more preferably, 300 nm to 2.0 μm. Further, a size of the second metal particle M2 may be 3.0 μm to 6.0 μm.

Hence, the first electrode 140 may include the second metal particles M2 having a volume greater than a volume of the second electrode 150.

Because the first electrode 140 includes the second metal particles M2 having the relatively large size as described above, reactivity of the metal particles can be further improved in the thermal process for firing. Further, the electrode can be fired more easily at a relatively lower temperature, and electrical characteristics (for example, a resistance) of the first electrode 140 can be further improved.

The first electrode 140 may be formed by performing a printing process on the first electrode paste twice, and the second electrode 150 may be formed by performing a printing process on the second electrode paste once.

More specifically, the first electrode 140 may be formed through first and second printing processes. In the first printing process, a first bus bar electrode paste including the first and second metal particles M1 and M2 may be printed on the front surface of the semiconductor substrate 110 in the second direction and then dried. In the second printing process, a first finger electrode paste including the first metal particles M1 may be printed on the front surface of the semiconductor substrate 110 in the first direction and then dried. Next, the first electrode 140 may be formed by performing the thermal process on the first bus bar electrode paste and the first finger electrode paste.

The second electrode 150 may be formed by printing once a second electrode paste including the first metal particles M1 on the back surface of the semiconductor substrate 110 in accordance with a pattern of the second finger electrodes 151 and a pattern of the second bus bar electrodes 152 and performing the thermal process on the second electrode paste.

However, the metal particles M1 and M2 included in the first and second electrodes 140 and 150 are not limited to FIG. 7 and may be formed unlike FIG. 7.

For example, the first electrode 140 may be formed by printing and drying a first electrode paste including the first and second metal particles M1 and M2 in accordance with a pattern of the first finger electrodes 141 and a pattern of the first bus bar electrodes 142 and then printing a separate first electrode paste including only the first metal particles M1 in accordance with the pattern of the first finger electrodes 141 and the pattern of the first bus bar electrodes 142.

In this instance, the first finger electrodes 141 as well as the first bus bar electrodes 142 may include the second metal particles M2 having a relatively larger volume.

Thus, the first electrode 140 may include metal particles having a volume relatively larger than the metal particles of the second electrode 150.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a semiconductor substrate;
a first conductive region positioned at a front surface of the semiconductor substrate, the first conductive region containing impurities of a first conductivity type or impurities of a second conductivity type;
an anti-reflection layer positioned on a front surface of the first conductive region;
a second conductive region positioned at a back surface of the semiconductor substrate, the second conductive region containing impurities of a conductivity type opposite a conductivity type of impurities contained in the first conductive region, and the second conductive region including a polycrystalline silicon material;
a control passivation layer positioned between the back surface of the semiconductor substrate and the second conductive region, the control passivation layer including a dielectric material;
a back passivation layer positioned on a back surface of the second conductive region;
a first electrode positioned on the front surface of the semiconductor substrate and connected to the first conductive region; and
a second electrode positioned on the back surface of the semiconductor substrate and connected to the second conductive region,
wherein each of the first and second electrodes includes silver particles and a glass frit including tellurium oxide (TeO),
wherein a thickness of the second conductive region is less than a thickness of the first conductive region,
wherein a thickness of the back passivation layer is less than a thickness of the anti-reflection layer and is greater than a thickness of the control passivation layer,
wherein crystallites formed by a combination of the silver particles of the second electrode and silicon of the second conductive region are distributed at an interface between the second electrode and the second conductive region, but not in the control passivation layer,
wherein a content of the glass frit per unit volume contained in the second electrode connected to the second conductive region having the thickness less than the thickness of the first conductive region is less than a content of the glass fit per unit volume contained in the first electrode connected to the first conductive region having the thickness greater than the thickness of the second conductive region, and
wherein the second electrode includes:
a first layer where the glass frit including tellurium oxide (TeO) is positioned at an interface between the second electrode and the second conductive region: and
a second layer where the glass frit not including tellurium oxide (TeO) is positioned on the first layer.

2. The solar cell of claim 1, wherein the content of the glass frit per unit volume contained in the first electrode is 6 wt % to 8 wt %, and
wherein the content of the glass frit per unit volume contained in the second electrode is 2.5 wt % to 5.0 wt %.

3. The solar cell of claim 1, wherein a content of the silver particles per unit volume contained in the first electrode is more than a content of the silver particles per unit volume contained in the second electrode.

4. The solar cell of claim 3, wherein the content of the silver particles per unit volume contained in the first electrode is 82 wt % to 92 wt %, and
wherein the content of the silver particles per unit volume contained in the second electrode is 68 wt % to 73 wt %.

5. The solar cell of claim 1, wherein the thickness of the anti-reflection layer is 100 nm to 140 nm, and
wherein the thickness of the back passivation layer is 65 nm to 105 nm within a range that is less than the thickness of the anti-reflection layer.

6. The solar cell of claim 1, wherein the thickness of the control passivation layer is 0.5 nm to 10 nm.

7. The solar cell of claim 1, wherein the thickness of the first conductive region is 300 nm to 700 nm, and wherein the thickness of the second conductive region is 290 nm to 390 nm within a range that is less than the thickness of the first conductive region.

8. The solar cell of claim 1, wherein the glass frit of the second electrode further includes at least one of a PbO-based material or a BiO-based material.

9. The solar cell of claim 1, wherein a melting point of the glass frit including tellurium oxide (TeO) is 200° C. to 500° C.

10. The solar cell of claim 1, wherein the glass frit of the first electrode includes at least one of a PbO-based material and a BiO-based material.

11. The solar cell of claim 1, wherein the silver particles of the first electrode include first silver particles having a circular shape or an oval shape and second silver particles which have a long axis and have a plate shape having an uneven surface, and
wherein the silver particles of the second electrode include the first silver particles and do not include the second silver particles.

12. The solar cell of claim 11, wherein a length of the long axis of the second silver particle included in the first electrode is greater than a size of the first silver particle included in each of the first and second electrodes.

13. The solar cell of claim 8, wherein the glass frit of the second electrode includes the PbO-based material.

14. The solar cell of claim 10, wherein the glass frit of the first electrode includes the PbO-based material.

15. The solar cell of claim 1, wherein the interface between the second electrode and the second conductive region is located between the back surface of the second conductive region and an interior of the second conductive region.

16. The solar cell of claim 1, wherein the second layer has a thickness that is less than the thickness of the back passivation layer.

* * * * *